United States Patent [19]

Martin

[11] Patent Number: 4,492,180
[45] Date of Patent: Jan. 8, 1985

[54] APPARATUS FOR INDEXING AND REGISTERING A SELECTED DEPOSITION MASK TO A SUBSTRATE AND METHOD THEREFOR

[75] Inventor: Richard T. Martin, Goleta, Calif.

[73] Assignee: Applied Magnetics Corporation, Goleta, Calif.

[21] Appl. No.: 243,825

[22] Filed: Mar. 16, 1981

[51] Int. Cl.³ .................. C23C 13/08; C23C 13/06
[52] U.S. Cl. ............................ 118/704; 118/720; 118/504; 118/726; 118/729; 118/730; 427/248.1; 427/282
[58] Field of Search ............... 118/704, 697, 715, 720, 118/721, 729, 730, 504, 505, 726; 204/298, 192 M; 427/282, 298.1

[56] References Cited

U.S. PATENT DOCUMENTS

| | | | |
|---|---|---|---|
| 3,238,918 | 3/1966 | Radke et al. | 118/720 |
| 3,669,060 | 6/1972 | Page et al. | 118/721 X |
| 3,747,558 | 7/1973 | Harel | 118/721 X |
| 4,036,171 | 7/1977 | Ramet | 118/720 |

OTHER PUBLICATIONS

Huntley et al., IBM Technical Disclosure Bulletin, vol. 21, No. 5, Oct. 1978, pp. 2024-2025.
Brewer et al., "Apparatus for Depositing Thin Film Devices" IBM Tech. Disclosure Bulletin, vol. 21, No. 7, Dec. 1978, pp. 3016-3018.

*Primary Examiner*—John D. Smith
*Assistant Examiner*—Bernard F. Plantz
*Attorney, Agent, or Firm*—Daniel J. Meaney, Jr.

[57] ABSTRACT

Apparatus for indexing and accurately registering a selected one of a plurality of deposition masks in operative relationship to a substrate comprising carriage means for supporting a plurality of deposition masks in an aligned spaced relationship relative to each other wherein each of the deposition masks has a selected number of prealigned registration members located thereon in a predetermined pattern and which are adapted to co-act with reference registration members loaded thereagainst, gantry means for supporting a substrate at a deposition station above the surface of the deposition masks having the prealigned registration members located thereon, reference registration members which are located on the substrate or around the periphery of the gantry means and which are directed towards and adapted to be loaded against the prealigned registration members to position the gantry means and the substrate relative to the selected one of said plurality of deposition masks, indexing means for transporting the carriage means including one or more deposition masks supported thereby or gantry means along a predetermined path and to index a selected one of the plurality of deposition masks to a deposition station, and gantry loading means which moves the carriage means and gantry means having the substrate and reference registration members toward each other to accurately register the substrate at a predetermined space and position relative to an indexed selected one of the plurality of deposition masks is shown. A method for indexing and accurately registering a substrate to a deposition mask is also shown.

29 Claims, 19 Drawing Figures

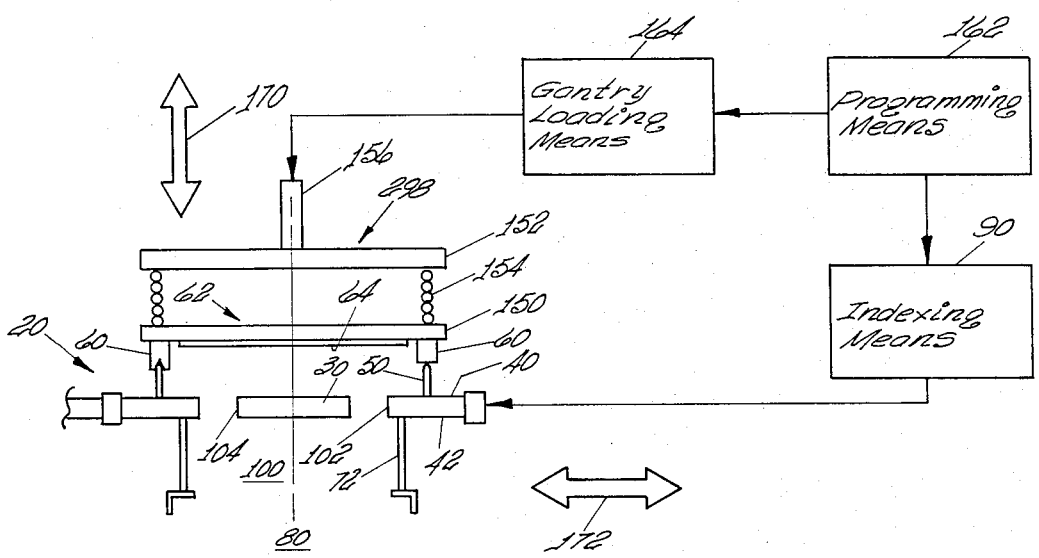
Fig 3
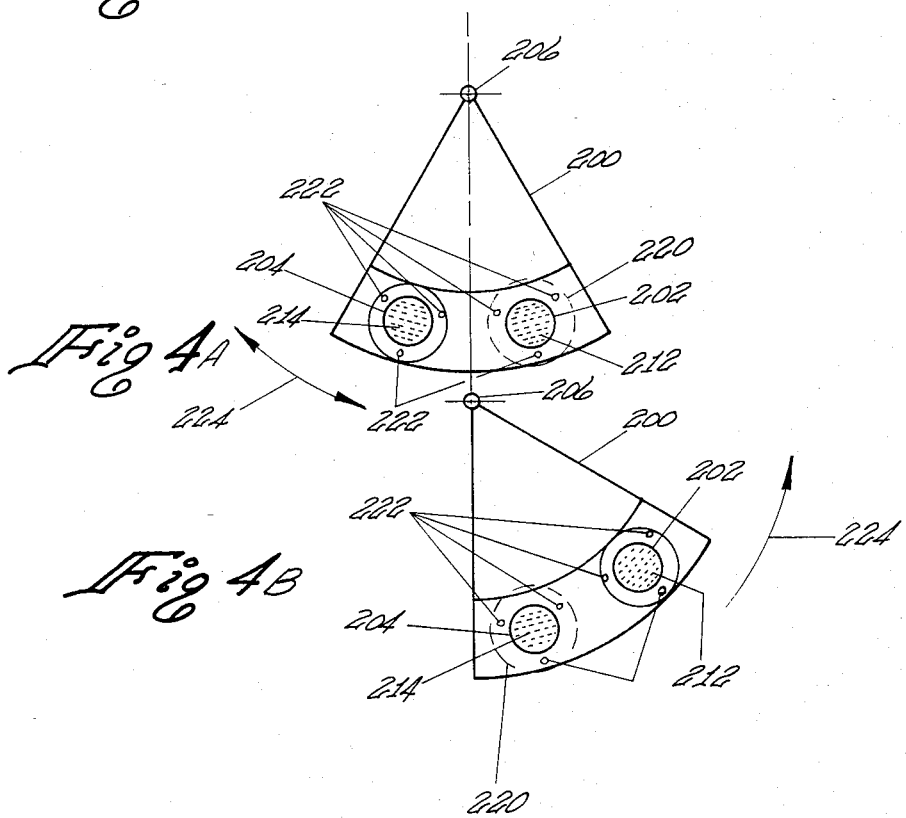
Fig 4A
Fig 4B

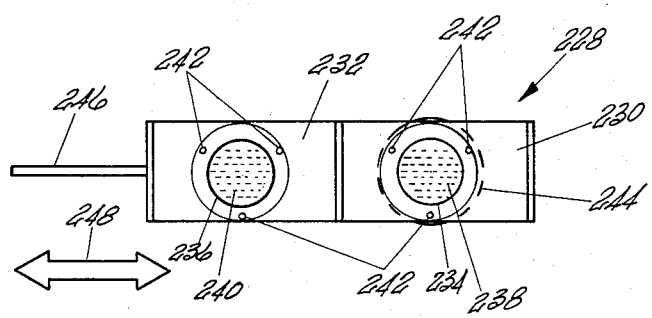
Fig 5
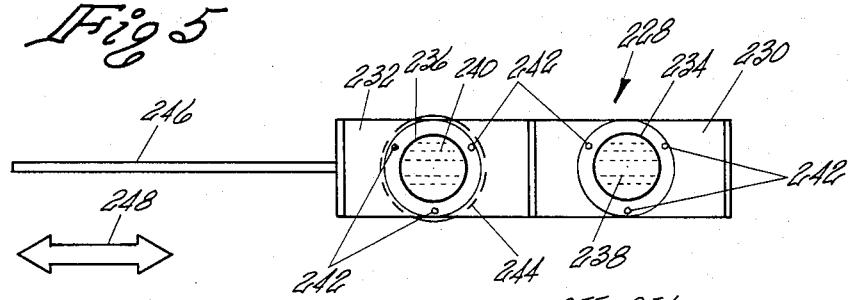
Fig 6
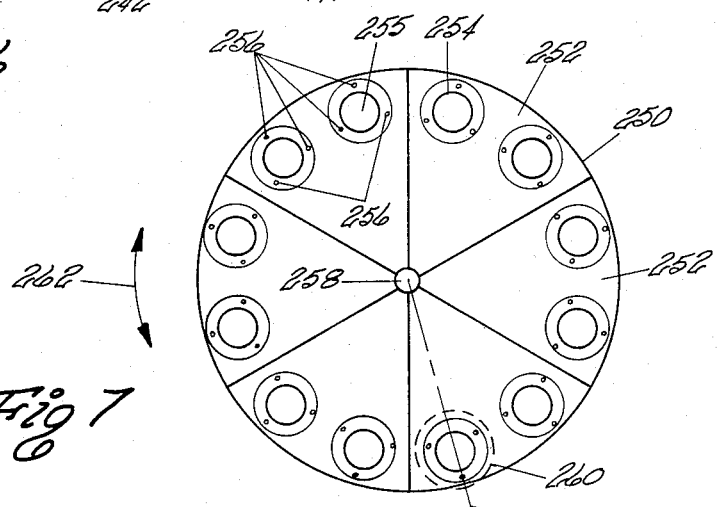
Fig 7
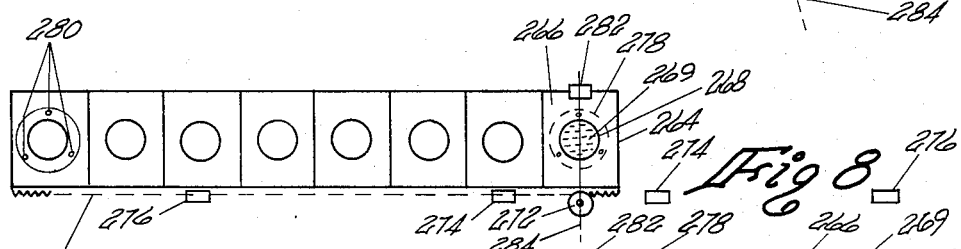
Fig 8
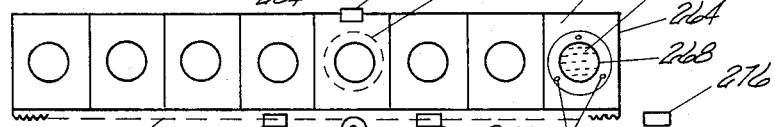
Fig 9
Fig 10
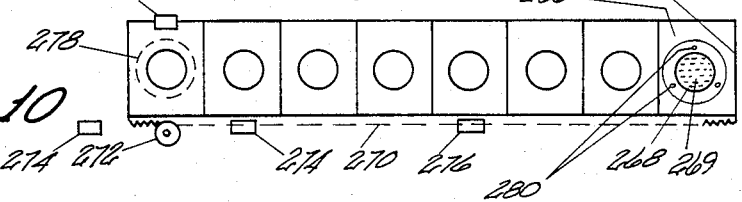

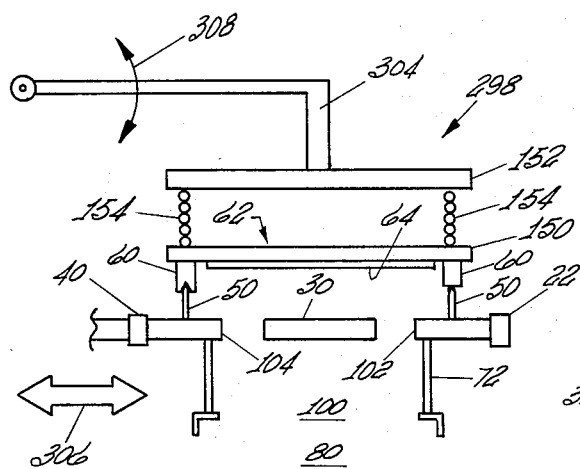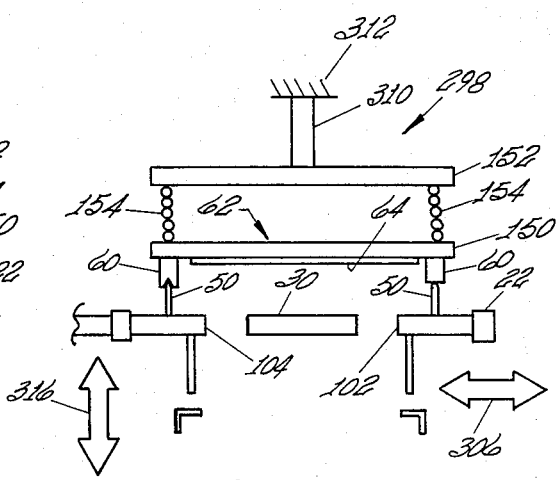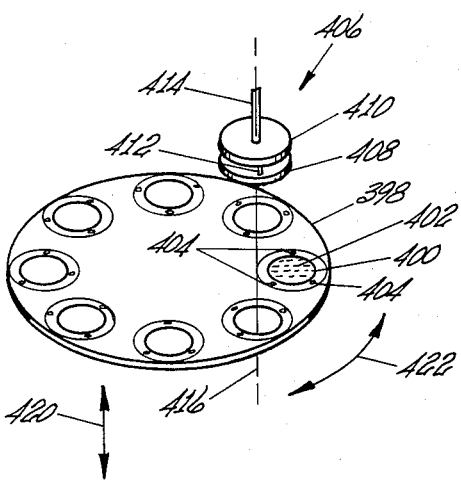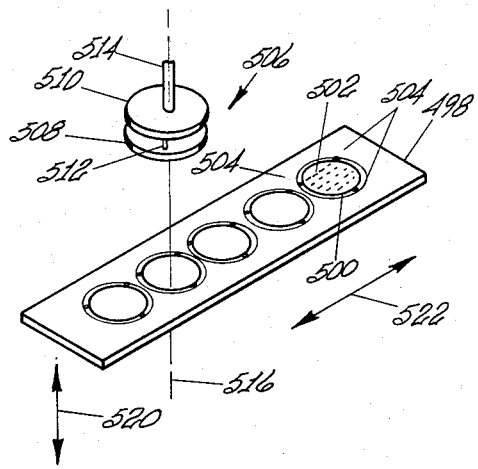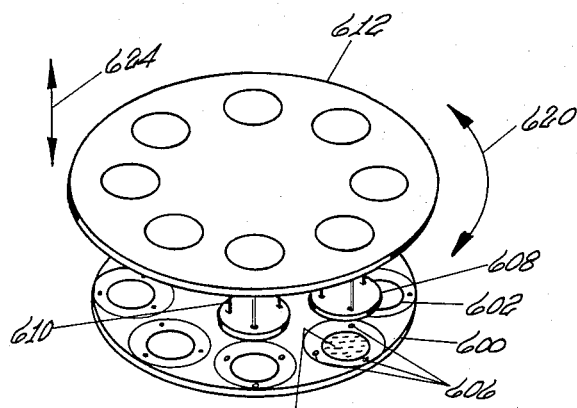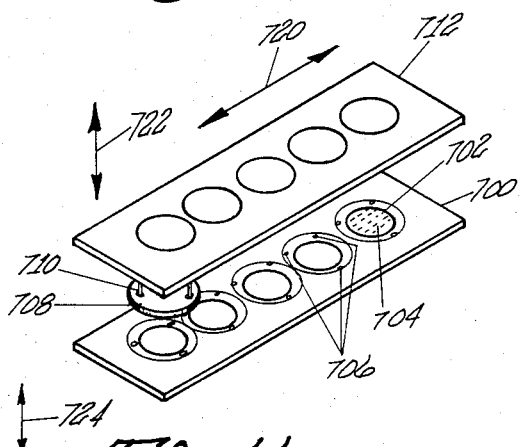

APPARATUS FOR INDEXING AND REGISTERING A SELECTED DEPOSITION MASK TO A SUBSTRATE AND METHOD THEREFOR

BACKGROUND OF THE INVENTION

1. Field of the Invention

This invention relates to apparatus and method for indexing and accurately registering a selected one of a plurality of deposition masks between a substrate and a source and more particularly to apparatus having a carriage assembly for indexing a selected mask from a plurality of masks adapted to be supported thereon between a substrate and a source and a gantry means which supports a substrate relative to the carriage assembly. The carriage assembly is utilized for indexing a selected mask from a plurality of masks between a substrate and a source in a vacuum deposition system.

2. Description of the Prior Art

It is known in the prior art to form thin film magnetic transducers by use of a stepped mask and vapor deposition techniques. Examples of thin film transducers so produced are disclosed in Gibson U.S. Pat. Nos. 4,191,983 and 4,143,458, which are assigned to the assignee of the present invention.

In fabrication of thin film magnetic transducers, it is common to form a pair of magnetic pole piece layers having deposited coils forming a coil winding therebetween and the two pole pieces which may have one or more layers per pole piece, having an interim gap formed therebetween. The gap is utilized for a transducing gap adapted to be positioned adjacent a recording media. In fabrication of the pole piece layers and one or more winding layers, any one of several techniques can be used in order to precisely control the width, length, depth and registration of the various layers relative to the prior deposited and post deposited layers. Typical of a magnetic transducer formed using such technique is that disclosed in U.S. Pat. No. 3,867,868 to Lazzari.

It is also known in the art to form a multi-track thin film magnetic transducer having a plurality of vapor deposited thin film transducers formed of a pair of magnetic pole pieces and windings therebetween. Typical of such transducers are those disclosed in U.S. Pat. No. 4,092,688 to Nomura et al.

In the fabrication of the thin film magnetic transducers disclosed by the above-referenced Patents, it is known in the art to utilize a mask for controling the pattern of deposited material onto a substrate during a deposition process.

One known prior art apparatus for forming thin film magnetic transducers of a plurality of vapor deposited layers utilizes a mask support assembly having a plurality of aligned apertures each of which support a mask having a predetermined pattern formed therein. In fabrication of the thin film magnetic transducers, it is necessary to carry out the vapor deposition in a vacuum chamber and to include apparatus which is adapted to transport the mask support assembly having the mask thereon which is located between a vapor deposition source and a substrate to index the mask support assembly to position a selected mask from a plurality of masks adjacent a substrate and between the source and the substrate and to precisely index a mask to the substrate. In fabricating thin film magnetic transducers, using the known apparatus it is necessary that precise indexing occur between the mask and the substrate so that proper registration and positioning of single or multiple deposited layers can be precisely established and controlled.

Other known techniques for fabricating thin film magnetic transducers include applying layers of preselected materials onto a substrate by use of known vacuum deposition, sputtering, plating, or chemical vapor deposition and then to selectively remove portions of the so formed layer by use of photo-etching techniques. In use of photo-etching techniques, the photo-resist material is coated onto the metallic thin film formed on the substrate through vapor deposition or plating processes. The photo-resist material is developed to form a photo-resist with a predetermined pattern wherein portions of the thin film layer to be removed are exposed and subjected to a chemical etching solution resulting in each layer of material in the thin film produced transducer having a preselected length, width, and depth in geometrical shape as determined by the photo-resist pattern formed thereon. One such method is disclosed in U.S. Pat. No. 3,891,995 to Hanazono et al.

A variation of this use of a photo-resist layer may include applying a layer of photo-resist material onto a substrate and forming apertures through the layer corresponding to areas to be plated. If an electroplating process is to be used, a layer of conductive material underlies the photo-resist layer and is used as a cathode in the plating process. If an electroless plating process is used, the layer of conductive material may be eliminated.

Another known technique for forming a thin film magnetic transducer is disclosed in U.S. Pat. No. 3,766,640 to Hahn. It utilizes magnetically permeable foil having grooves and a predetermined pattern formed therein which is adapted to receive deposited insulator and conductor material therein and which results in the foil member acting as both a portion of the magnetic transducer and as a pattern which determines the geometrical shape, width, and depth of the deposited layers.

Another known technique utilizes plating through a mask with a conductive material to form plated layers of magnetic insulating and conductive materials which define a plated layer magnetic transducer.

SUMMARY OF THE INVENTION

This invention relates to a new, novel and unique apparatus which separately indexes and accurately registers a selected one of a plurality of stabilized deposition masks supported on a carriage assembly between a substrate and a vapor deposition source.

In the preferred embodiment, the apparatus includes a carriage means and a gantry means which supports a substrate relative to the carriage means and in operative position with a vacuum deposition source.

The carriage means may be formed in any one of a number of shapes or structures. In the preferred embodiment, the carriage means is in the form of a mask supporting means which is elongated in shape and has the plurality of stabilized deposition masks spaced thereon in a predetermined position relative to each other. An elongated mask supporting means is indexed by transportation thereof along a linear predetermined path.

Also, the carriage means may include a mask supporting means formed into a sector of a circle having the plurality of stabilized masks radially aligned with the center thereof with a predetermined angle between each radially aligned stabilized deposition mask. The sector mask supporting means is indexed by transportation thereof along an arcuate predetermined path.

In addition, the carriage means may be circular or annular in shape and index the stabilized deposition mask by either unidirectional or bidirectional rotation of the annular shaped carriage means.

In use, the apparatus for indexing and accurately registering stabilized deposition masks of the present invention provides a unique and novel means for indexing a carriage means such that a selected stabilized deposition mask of a plurality of stabilized deposition masks can be positioned at a working station and in the preferred embodiment in substantial alignment between a source of vapor deposition material and a substrate such that vapor deposition occurs of the vapor material through the stabilized deposition mask onto the substrate. Further, as the carriage means is subjected to high temperatures, typical of vapor deposition processes, it essentially grows in length and width due to thermal expansion and experiences some warping, bending and the like. The transporting means of the preferred embodiment of the present invention is capable of accurately indexing a stabilized deposition mask to a working station independent of the carriage means dimensions which vary in response to variations in ambient temperature, stress and the like.

Accurate registration of a substrate to the carriage means is obtained by a gantry means which is loaded against and accurately registers a substrate to a stabilized deposition mask through a gantry loading means.

The present invention overcomes several of the disadvantages of prior apparatus and methods. In known prior art methods for forming thin film transducers using vapor deposition, a carriage mask support assembly was designed to transport a plurality of masks along a predetermined path relative to a working station in order to precisely position a selected mask from a plurality of masks to a substrate at a working station which, in the preferred embodiment, is a vapor deposition stage. Typically, a known carriage mask support assembly, when exposed to high temperatures such as that in a vacuum deposition process undergoes dimensional changes due to thermal expansion, warping and distortions of the carriage mask support assembly. In the known prior art apparatus, the masks were clamped to a carriage mask support assembly by means of fasteners. The carriage mask support assembly performed the functions of both indexing a mask to the work area and concurrently attempted to precisely position the selected mask to a substrate. When the mask and carriage mask support assembly and substrate support assembly, were exposed to the varying thermal environment, at thermal conditions normally experienced in a vapor deposition process, both the mask and carriage mask support assembly and substrate support assembly expanded and contracted during the process. In the prior art apparatus, the changes in dimension due to such expansion and contraction, warping and distortion were uncompensated for during the indexing and precise positioning process in a deposition operation. Thus, in a multi-step process where a plurality of masks had to be accurately positioned to a substrate, it was necessary that the temperature of the mask, carriage mask support assembly and substrate support assembly be held at a constant temperature. In use, the temperature of the mask and the carriage mask support assembly and substrate support assembly varied due to variation in the thermal environment during the process causing variation in dimension between the mask, carriage mask support assembly and its relationship to the substrate thereby inducing misregistration between the masks relative to the substrate and the layers deposited on the substrate.

Therefore, in the environment of a vapor deposition cycle, the known prior art apparatus lacks means to precisely register the carriage-mask support assembly to a substrate in order to obtain precise mask alignment between a selected mask and a substrate. By use of the teachings of the present invention which overcomes the prior art apparatus inability to precisely index a selected mask to a substrate in a vapor deposition process with varying thermal environment conditions, layers of selected material can be deposited by vapor deposition in a precise location on the substrate in a multi-step process in varying thermal environment conditions.

An advantage of the present invention is that distortion caused by thermal expansion, contraction, warping, bending or the like of a carriage assembly due to varying thermal environment conditions will affect only the coarse indexing of a selected mask to a substrate at a working station and its adverse effects on precise registration of a mask to a substrate are eliminated.

In the known prior art apparatus for positioning a mask in a deposition work stage, the carriage assembly undergoes constant expansion, contraction and warpage due to variation in temperature which occurs principally during the heating and cooling of the mask support assembly.

In order to minimize the effects of contraction, expansion and warpage of a mask, the prior art apparatus utilized fastening means to fixedly attach the deposition masks to the carriage supporting same and the carriage means was moveably mounted on a base in order to obtain accurate registration of the mask to a substrate at a working station. However, mask misregistration still occurred due to variations in the coefficient of thermal expansion between the carriage, masks, base and substrate support assembly. Even if the mask, carriage, base and substrate support assembly were of the same material, the mass, thickness and difference in geometrical dimension and shape and non-uniform temperatures resulted in malfunction or inadequate performance of the mask registration system.

One advantage of the present invention is that the apparatus of the present invention utilizes a carriage means in response to an indexing means to perform the function of indexing a stabilized mask to a working station such that the effects of contraction, expansion and warpage of the carriage means do not substantially affect the steps of indexing or accurate registering.

Another advantage of the present invention is that the apparatus of the present invention utilizes a gantry means which co-acts with a deposition mask supported by the carriage means in order to accurately register a substrate with a deposition mask indexed to a deposition station by the carriage means.

Still another advantage of the present invention is that the carriage means can have nonlinear or non-uniform thermal expansion in both its length and width and still be indexed to any selected mask along the entire length of the carriage means such that the selected mask is adequately indexed within an acceptable tolerance range to a substrate or deposition station independent of the thermal expansion of the carriage means.

Another advantage of the present invention is that an elongated mask supporting means, in the preferred embodiment, can be supported for transportation by an equivalent three point suspension and support which enables the elongated mask supporting means to undergo thermal expansion and contraction and distortion while being indexed without binding, or siezing of the elongated mask supporting means and three point suspension and support.

Yet another advantage of the present invention is that a carriage means in the form of an elongated carriage means can be supported by the equivalent of a three point suspension and support in combination with a separation inhibiting means which functions to maintain the carriage means in moveable supporting engagement with the three point equivalent suspension and support independent of the position of the elongated mask supporting means relative to the substrate or deposition station.

A further advantage of the present invention is that precise registration of a substrate can be performed to each selected mask indexed to the deposition station by a separate registration means such that the positioning of a mask relative to the substrate or deposition station is accomplished by indexing the carriage means such that a selected mask is located at a deposition station and accurate registration of a substrate to the so indexed mask can be obtained by separate alignment of the substrate relative to the specific selected mask.

A yet further advantage of the present invention is that a plurality of masks can be positioned in a programmed manner wherein each of the apertures and any selected mask supported thereby can be indexed to a deposition station at approximately the location of the substrate and thereafter, the substrate is then precisely aligned to the so-indexed selected mask to form a predetermined spaced and accurate registration therewith.

A still yet further advantage of the present invention is that the teachings hereof can be utilized to fabricate any number of devices or components such as, without limitation, thin film magnetic transducers, thin film resistors, thin film capacitors, integrated circuits and the like.

A still yet further advantage of the present invention is that a stabilized deposition mask can be mounted in a carriage means to increase the accuracy of the registration between the substrate and deposition mask.

A still yet additional advantage of the present invention is that the substrate and gantry means can be thermally stabilized to increase accuracy of the registration between the substrate and deposition mask.

BRIEF DESCRIPTION OF THE DRAWING

The foregoing and other advantages and features of this invention will become apparent from the following description of the preferred embodiment, when considered together with the illustrations and the accompanying drawing which includes the following Figures:

FIG. 3 is a partially pictorial front plan view showing an elongated shaped carriage means in accurate registration with a selected one of a plurality of deposition masks indexed to a deposition station and a partial block diagram showing a programming means which controls the indexing means and gantry loading means;

FIGS. 4 A and 4 B are pictorial top plan views showing a sector shaped carriage means having two apertures, the centers of which are radially aligned with the center of the sector shaped carriage means wherein each mask is separated by a predetermined angle of rotation and with each mask of said two masks indexed to a deposition station;

FIGS. 5 and 6 are top plan views of an elongated shaped carriage means having two apertures located in the same plane, the centers of which are aligned and which are separated by a selected distance and wherein each mask is indexed to a deposition station;

FIG. 7 is a pictorial representation of an annular shaped carriage means having a plurality of sectors each of which have at least one aperture which is located in the same plane wherein the annular shaped carriage means is adapted to index a selected one of a plurality of deposition masks to a deposition station;

FIGS. 8, 9 and 10 illustrate diagrammatically an elongated shaped carriage means having a plurality of apertures which are located in the same plane and which are adapted to each support a deposition mask; a single support roller, one pair of central guide rollers, one pair of remote guide rollers and an indexing means for transporting the elongated carriage means along a predetermined path which is substantially parallel to the direction of elongation thereof with the elongated carriage means being shown in a far left position, a center position and a far right position, respectively;

FIG. 11 is a pictorial front plan view of a gantry means including a gantry loading means operatively coupled thereto for accurately registering a gantry means with a substrate to a mask located in the carriage means wherein the carriage means is transported along a predetermined path and the gantry loading means moves the gantry means towards and away from the carriage means;

FIG. 12 is a pictorial front plan view of a gantry means for accurately registering a substrate to a mask located in the carriage means wherein a fixed platform supports the gantry means in position and the gantry loading means is operatively coupled to the carriage means for moving the same towards and away from the gantry means;

FIG. 13 is a pictorial representation of an annular shaped carriage means having a plurality of radially aligned, spaced planar apertures each of which are adapted to support a deposition mask, a single fixed gantry means adapted to support a substrate and indexing means and gantry loading means which are operatively coupled to the annular shaped carriage means to index a selected mask to a deposition station and to move the annular shaped carriage means towards and away from the gantry means when a deposition mask is indexed to the deposition station to load the reference registration members against the prealigned registration members;

FIG. 14 is a pictorial representation of an elongated shaped carriage means having a plurality of planar, spaced, aligned apertures each of which are adapted to support a deposition mask, a fixed single gantry means adapted to support a substrate and indexing means and gantry loading means which are operatively coupled to the elongated shaped carriage means to index a selected mask to a deposition station and to move the elongated shaped carriage means toward and away from the gantry means when a deposition mask is indexed to the deposition station to load the reference registration members against the prealigned registration member;

FIG. 15 is a pictorial representation of a fixed annular shaped carriage means having a plurality of radially aligned, spaced planar apertures, each of which are adapted to support a deposition mask, a carousel gantry platform means adapted to support a plurality of gantry means wherein the carousel gantry platform means is operatively coupled to an indexing means to index each of the plurality of gantry means to a deposition mask at each deposition station, and gantry loading means to move the carousel gantry platform means towards and away from the fixed annular shaped carriage means to load the reference registration members of each gantry means against the prealigned registration members of each deposition mask on the annular shaped carriage means; and FIG. 16 is a pictorial representation of a fixed elongated shaped carriage means having a plurality of planar, spaced aligned apertures each of which are adapted to support a deposition mask, an elongated gantry platform means adapted to support and index in a linear direction relative to the elongated shaped carriage means at least one of a plurality of gantry means each of which are adapted to support a substrate and wherein the elongated gantry platform means is operatively coupled to an indexing means and a gantry loading means to index at least one of a plurality of gantry means to a deposition mask at a deposition station and to move the elongated gantry platform means towards and away from the fixed elongated shaped carriage means to load the reference registration members of at least one gantry means against the prealigned registration members of the at least one deposition mask on the elongated shaped carriage means.

DESCRIPTION OF THE PREFERRED EMBODIMENT

Figure 1A:
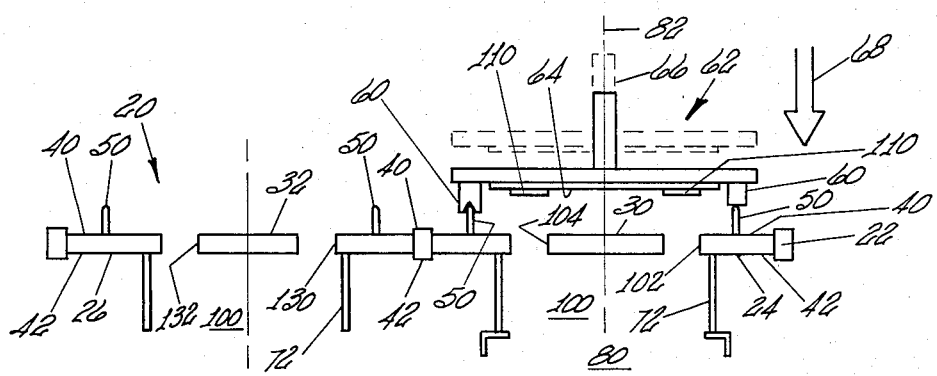
FIGS. 1 A, 1 B and 1 C are pictorial representations showing an elongated shaped carriage means which includes two masks, a vapor deposition source, a shield having a cavity extending therethrough and means for supporting a mask within the elongated carriage means and a gantry means having reference registration members located thereon showing the steps for indexing and accurately registering a substrate to an indexed selected one of a plurality of deposition masks positioned at a deposition station.
Figure 1B:
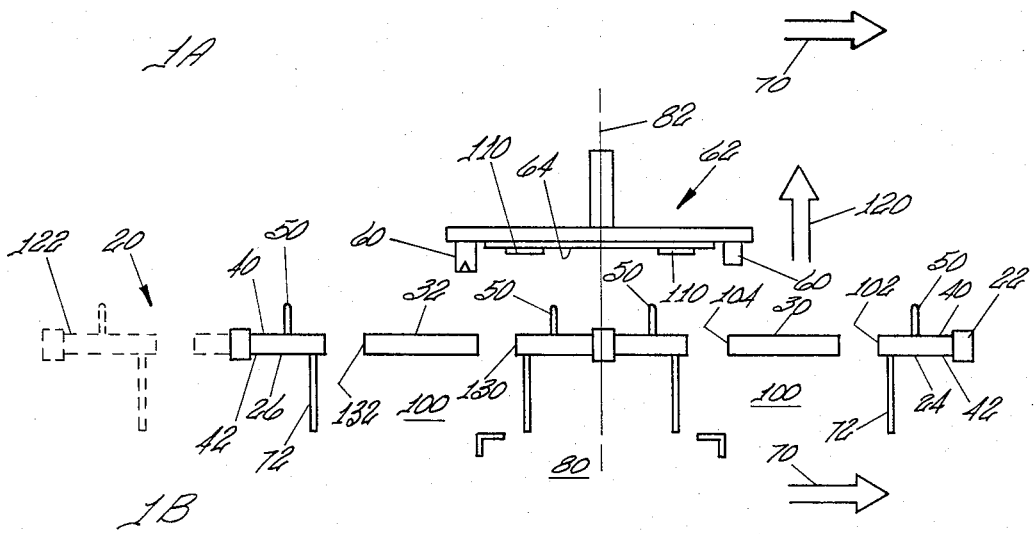
Figure 1:
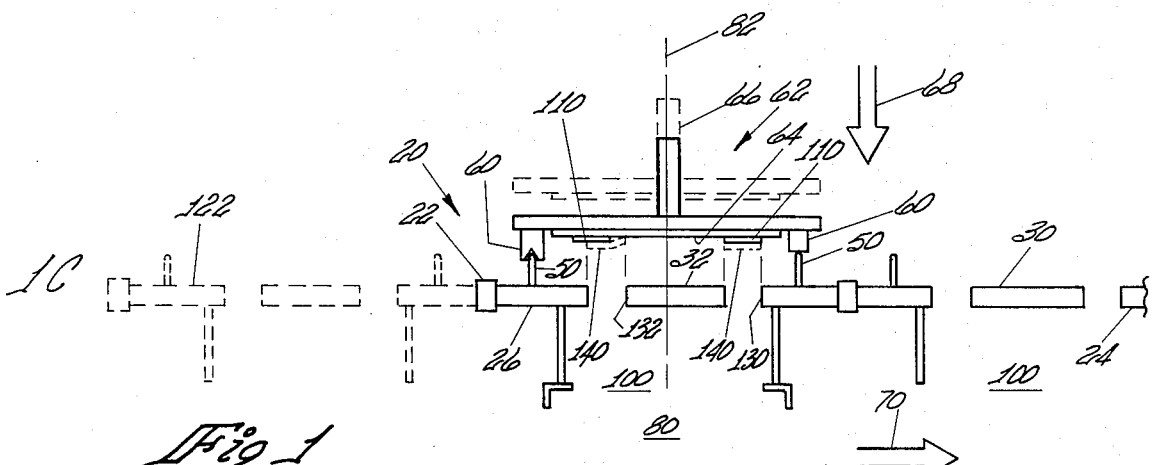

FIGS. 1 A, 1 B and 1 C illustrate pictorially the apparatus or a carriage assembly for indexing and accurately registering a substrate in operative relationship to a deposition mask. The apparatus includes a carriage means shown generally as 20 which, in the preferred embodiment, is an elongated carriage means 22 having two or more discrete sections 24 and 26. The elongated carriage means 22 supports a plurality of deposition masks 30 and 32 located in sections 24 and 26 respectively. The elongated carriage means 20 has an upper surface 40 and a lower surface 42 which define a plurality of predetermined apertures extending from the upper surface 40 to the lower surface 42. The carriage means 20 supports each of the deposition masks 30 and 32 in an aligned relationship relative to each other and are spaced between the centers thereof.

Each of the deposition masks 30 and 32 have affixed to one surface thereof a selected number of prealigned registration members 50, such as for example alignment pins formed into a predetermined position relative to the mask opening and which are adapted to co-act with an equal number of reference registration members 60, such as for example cone, vee or flat shaped receiving cups, located on a gantry means 62. The reference registration members 50 are loaded against the prealigned registration members 60. The carriage means 20 is adapted to transport the deposition masks 30 and 32 along a predetermined path as shown by arrow 70.

A vacuum deposition source 80 is located at a deposition station which is in opposed spaced relationship to the gantry means 62 which supports a substrate 64. The vacuum deposition source 80 is positioned in opposed substantial alignment with the gantry means 62 and substrate 64 as shown by line 82.

The carriage means 20 includes a plurality of shields 72, each of which have a cavity extending therethrough, and are positioned on the carriage means 20 on the side opposite to that having the prealigned registration members. The shields 72 extend a predetermined distance from the opposite surface of masks 30 and 32. Each of the shields 72 is adapted to be transported along with its associated deposition mask and indexed therewith by the carriage means 20.

As shown in FIGS. 1 A, 1 B and 1 C, the carriage means 20 is adapted to transport the deposition masks 30 and 32 along a predetermined path to a deposition station located between the substrate 64, supported by the gantry means 62, and the vacuum deposition source 80.

As illustrated in FIG. 3, an indexing means 90 is operatively coupled to the carriage means 20 for transporting the carriage means 20 including the deposition mask 30 along the predetermined path to index any selected one of the plurality of deposition masks to a deposition station. Also in this embodiment, a gantry loading means 164 is operatively coupled to the gantry means 62 for moving the gantry means 62 towards and away from the masks which is considered in greater detail in connection with the further discussion of FIG. 3 hereinbelow.

Referring again to FIG. 1 A, the gantry means 62 supports a substrate 64 at the deposition station above the surface of the deposition mask 30 having the prealigned registration members 50. The gantry means 62 is positioned in opposed spaced relationship to the carriage means 20. In the preferred embodiment, the gantry means 62 is responsive to the gantry loading means 164 of FIG. 3 to move the substrate 64 towards and away from the upper surface of selected deposition masks 30 or 32 indexed to the deposition station by the carriage means 20. The reference registration members 60 are located on the gantry means 62 and positioned around the periphery of the substrate 64 and are directed towards the surfaces of the deposition masks 30 and 32 having the prealigned registration members 50.

When the gantry means 62 is moved from its withdrawn position, shown by dashed lines 66 in FIG. 1 A, to its loaded position, the reference registration members 60 are urged into loading engagement with the prealigned registration members 50. As the gantry means 62 is moved towards deposition mask 30 as illustrated by arrow 68, the reference registration members 60 slideably engage and load against the prealigned registration members 50, which move and position the gantry means 62 and the substrate 64 relative to the selected stabilized deposition mask 30, to accurately register the substrate 64 at a predetermined spacing and position relative to the indexed deposition mask 30.

In operation in the preferred embodiment, the vacuum deposition source 80 produces a vapor of preselected deposition material which passes through the interior 100 of the shields 72 generally along a path shown by line 82 which extends through the deposition station. As shown in FIG. 1 A, vapor of the preselected deposition material from source 80 passes through the shields 72 and through the apertures 102 and 104 of deposition mask 30 onto the surface of substrate 64. In FIG. 1 A, the vapor deposited layer is shown by layer 110. In addition, deposition mask 32 has apertures 130 and 132 formed therein.

After the vapor deposited layer 110 has achieved the desired thickness, the gantry means 62 is moved by the gantry loading means 164 of FIG. 3 to its withdrawn position as shown by dashed lines 66 of FIG. 1 A. Thereupon the indexing means 90 which is illustrated in FIG. 3, transports the carriage means 20 to index a different selected one of the plurality of deposition masks 30 and 32 to the deposition station.

FIG. 1 B illustrates the gantry means 62 in a withdrawn position which is achieved by moving the same away from the upper surface 40 of deposition mask 30 and in the direction shown by arrow 120.

The carriage means 20 is transported in the direction shown by arrow 70 from the original position shown by dashed lines 122 of FIG. 1 B.

When the indexing means 90, shown in FIG. 3, has moved the carriage means 20 such that a different deposition mask is indexed to the deposition station, the gantry loading means 164 moves the gantry means 62 with the substrate 64 towards the different deposition mask 32 which is illustrated in FIG. 1 C. The carriage means 20 has been indexed from the position as shown by dashed lines 122. The process of moving the gantry means 62 towards the deposition mask 32 in the direction of arrow 68 is commenced by the gantry loading means 164 shown in FIG. 3, which brings the reference registration members 60 into engagement with the prealigned reference members 50 resulting in accurate registration of the substrate 64 to the deposition mask 32. A vapor of preselected material emanates from the vacuum source 80, passes through apertures 130 and 132 of mask 32 onto the substrate 64 and, in the same instance, into registration with or overlapped with prior vacuum deposited layer 110. As illustrated in FIG. 1 C, a second vacuum deposited layer 140 is accurately registered on and to the prior vacuum deposited layer 110.

This process is repeated as many times as desired to produce a plurality of vacuum deposited layers on substrate 64 to form a desired component.

Figure 2:
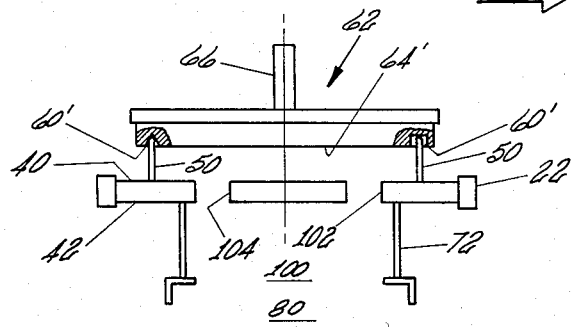
FIG. 2 is a pictorial representation of an elongated shaped carriage means, a vapor deposition mask, a vapor deposition source, a shield having a cavity extending therethrough, means for supporting the deposition mask in the carriage means, a gantry means and a substrate wherein the substrate has the reference registration members formed thereon which co-act with prealigned registration members and wherein the substrate and gantry means are accurately registered to the deposition mask.

FIG. 2 illustrates substantially the same information and detail as described in connection with FIGS. 1 A, 1 B and 1 C and the same elements are labelled with the same numerals. However, the reference registration members, shown as 60 in FIGS. 1 A, 1 B and 1 C and which are located on the gantry means, are shown as 60' in FIG. 2 and are located in and integral with the substrate 64'.

It is envisioned that the reference registration members are located on at least one of the gantry means and the substrate and are formed thereon in a predetermined pattern and are adapted to co-act with the prealigned reference registration members.

FIG. 3 illustrates one embodiment of a means for enabling the gantry means 62 to accurately register a substrate 64 to a mask 30. The gantry means 62 includes a baseplate 150 which is supported from a platform 152 by flexible support means such as, for example chains 154, to form a gantry assembly 298. The gantry loading means 164 moves the gantry means 62 through a support means 156 which in the preferred embodiment is a gantry assembly 298, towards and away from the mask 30 as shown by bidirectional arrow 170 in order to accurately register a substrate 64 to the mask 30 in the manner described hereinabove.

The indexing means 90 likewise indexes the carriage means 20 in the direction as shown by the bidirectional arrow 172.

As illustrated in FIG. 3, the carriage assembly further includes a programming means 162 which is operativley coupled to the indexing means 90 and the gantry loading means 164 for actuating the gantry loading means 164 to afford relative movement between the gantry means 62 and an indexed selected one of the plurality of deposition masks 30 and 32 (FIG. 1 A) supported in the carriage means 20 to separate the same and to afford relative movement between the carriage means 20 and gantry means 62 to move the same towards each other to load and accurately register a substrate 64 supported by said gantry means 62 to an indexed selected one of the plurality of stabilized deposition masks 30 and 32 supported by the carriage means 20 and for actuating the indexing means 90 for transporting the carriage means 20 including the plurality of deposition masks 30 and 32 along a predetermined path, as illustrated in FIGS. 1 A, 1 B and 1 C, when the gantry means 62 is separated from the carriage means 20 to index a selected one of the plurality of deposition masks 30 and 32 at a deposition station. It is envisioned that the indexing means 90 or gantry loading means 164 could be operatively coupled to the other of the carriage means 20 and gantry means 62 to obtain the desired indexing and accurate registration therebetween.

FIGS. 4 A and 4 B show a sector shaped carriage means 200 having two apertures 202 and 204 formed therein which are located in the same plane and have the centers thereof radially aligned with a center of rotation 206. Each aperture 202 and 204 has a deposition mask 212 and 214, respectively, supported therein. The deposition station is illustrated by dashed circle 220. Each deposition mask 212 and 214 has a plurality of prealigned registration members 222 formed into a predetermined pattern and located around the periphery thereof. The prealigned registration members 222 are prealigned to the deposition mask 212 and 214 such that reference registration members on the deposition mask are positioned in a predetermined location relative to the prealigned registration members 222. Indexing means, represented by arrow 224, are adapted to rotate the sector shaped carriage means 200 to index a selected deposition mask to the deposition station 220.

FIGS. 5 and 6 illustrate a carriage means which is in the form of an elongated shaped member 228. The elongated shaped member 228 has two sectors 230 and 232. Each sector 230 and 232 has an aperture 234 and 236, respectively, formed therein which extends through the upper and lower surfaces of each sector 230 and 232. Apertures 234 and 236 have the centers thereof aligned in a substantially straight line with the centers spaced relative to each other. Each aperture 234 and 236 support a deposition mask 238 and 240, respectively. Each deposition mask 238 and 240 includes a plurality of prealigned registration means 242 formed in a predetermined pattern around the periphery thereof.

An indexing means in the form of a linear actuator 246 is operatively coupled to one end of section 232 to transport the elongated shaped carriage means 228 along a linear predetermined path which is substantially parallel to the aligned centers of apertures 234 and 236. The direction of movement of the indexing means is linear as shown by arrow 248. The deposition station is shown by dashed circle 244.

In operation, the indexing means, linear actuator 246, transports the elongated shaped carriage means 228 along a linear predetermined path and function to index either of the masks 238 and 240 to the deposition station 244. Of course, the gantry means (not shown) would include the co-acting reference registration means to obtain accurate alignment of the gantry means and substrate to the deposition mask indexed to the deposition station 242.

FIG. 7 illustrates an annular shaped carriage means 250 having a plurality of sector shaped members 252. The annular shaped carriage means 250 has a plurality of apertures 254 formed around the periphery thereof for supporting a deposition mask therein. The centers of each aperture 254 are aligned in an annular path which is co-axially aligned with the center 258. Each aperture 254 has a deposition mask 255 located therein and each deposition mask has a plurality of prealigned registration means 256 located around the periphery thereof. The deposition station is illustrated by dashed circle 260. Indexing means shown by arrow 262 is adapted to rotate the carriage means 250 through a predetermined angle of rotation.

FIGS. 8, 9 and 10 illustrate pictorially a different embodidiment of an elongated shaped carriage means 264 having a plurality of individual sections, of which section 266 is typical, formed therein. Each section 266 has an aperture 268 formed therein. The centers of each of the apertures are aligned in a substantially straight line and are spaced between the centers thereof. Aperture 268 is adapted to support a deposition mask 269 therein with the deposition mask 269 shown in section 266 being typical. Thus, the centers of each deposition mask 269 are aligned with each other. Each deposition mask 269 includes a plurality of prealigned registration members 280 located thereon.

In substance, the elongated carriage means defines a carriage assembly for indexing a selected mask having prealigned registration members from a plurality of masks between a substrate and a source. Such an arrangement is illustrated in greater detail in FIGS. 11 and 12. The mask supporting means 264 includes means adapted for positioning each mask of a plurality of deposition masks in a predetermined position relative to each other. This is accomplished by supporting a deposition mask in each aperture 268 of each section 266.

Transporting means, in the preferred embodiment, is a translatably mounted rack 270 having a coefficient of expansion which is substantially equal to that of the elongated mask supporting means 264. The translatably mounted rack 270 cooperates with a drive gear 272 to transport the carriage means 264 to index a selected one of the plurality of masks located in the aperture 268 to a deposition station shown by dashed circle 278.

By matching the coefficient of expansion of the translatably mounted rack 270 to that of the elongated shaped carriage means 264, as the elongated shaped carriage means 264 experiences thermal expansion and contraction, the translatably mounted rack 270 will undergo a similar expansion and contraction as that of the elongated shaped carriage means 264 such that the number of teeth which are located between the centers of each adjacent aperture and deposition mask located therein remain substantially fixed. The meshing relationship between teeth formed on the surface of drive gear 272 and teeth on the translatably mounted rack 270 maintain their meshing capabilities throughout the thermal expansion and contraction of the elongated shaped carriage means 264 and the translatably mounted rack 270.

Prealigned registration means shown as 280 in FIG. 8, are formed of a selected number of prealigned registration members arranged in a predetermined pattern with one set of each being located adjacent each of the deposition masks located in the apertures. Thus, each of the deposition masks have an identical number of prealigned registration members located thereon which are formed into substantially the same pattern.

In FIGS. 8, 9 and 10, the elongated shaped carriage means 264 is supported by an equivalent three point suspension and support when the elongated shaped carriage means 264 is positioned to index any selected one of the plurality of masks to a deposition station.

FIG. 8 illustrates the elongated shaped carriage means 264 in a far left off center position. In that position, a support roller 282, one central guide roller 274 and one remote guide roller 276 provide the equivalent of the three point support and suspension.

FIG. 9 illustrates the elongated shaped carriage means 264 in its center position. In a center position, the equivalent three point support and suspension is provided by support roller 282, and by the central guide rollers 274. As illustrated in FIG. 9, the remote guide rollers 276 are located relative to the elongated shaped carriage means 264 such that when the indexing means, which comprises the translatably supported rack 270 and the driving gear 272, indexes the elongated shaped carriage means 264 either to the left or to the right, one of the pair of remote guide rollers 276 will engage the end thereof and provide the additional support necessary to transport and index the elongated shaped carriage means 264.

FIG. 10 illustrates the elongated shaped carriage means 264 in a far right position wherein the equivalent three point support and suspension is provided by support roller 282, one central guide roller 274 and one remote guide roller 276.

In the preferred embodiment, the central guide rollers 274 and the remote guide rollers 276 are grooved rollers. The guide rollers 274 and 276 are mounted relative to each other such that the grooves form a line of support and the so formed line of support is located within the predetermined path over which the indexing means transports the elongated shaped carriage means 264. The grooved rollers cooperate with the elongated shaped carriage means 264 to establish a line of support within the predetermined path. The grooves of the guide rollers 274 and 276 establish a line of support which restrains or constrains an edge of the elongated shaped carriage means 264 such that thermal expansion and contraction and distortion of the elongated shaped carriage means 264 along the line of support is restrained to the line of support and thermal expansion and contraction of the elongated shaped carriage means 264 in all other directions other than along the line of support is unconstrained. The effect of the three point support and suspension is to permit the elongated shaped carriage means 264 to experience thermal expansion, warpage or bending, which effects do not interfere with or affect the ability of the indexing means to transport and index a selected deposition mask from a plurality of deposition masks to a deposition station which is illustrated by the dashed circle 278.

As illustrated herein, the carriage assembly for indexing a selected mask from a plurality of masks to a deposition station between an aligned substrate and source comprises a carriage means which can be formed into a variety of shapes such as, for example, an elongated means, a sector means, an annular shaped means or a curvilinear shaped means. The so formed carriage means includes means adapted for supporting each mask of a plurality of deposition masks in a predetermined position relative to each other.

In addition, all of the carriage means includes means operatively coupled to a mask supporting means for confining displacement of the mask supporting means at a point of confinement and for confining rotational movement of said mask supporting means about a vertical axis which passes through a plane of reference at the point of confinement. The point of confinement is defined as that point where the vertical axis intersects a line of reference located within the plane of reference. In the embodiment of an elongated shaped carriage means 164 as illustrated in FIGS. 8, 9 and 10, the line of reference identified as dashed line 284, is substantially perpendicular to the line of support established by the grooved guide rollers 274, and 278. In the embodiment of FIGS. 4 A, 4 B and 7, the line of reference, likewise illustrated as dashed line 284, extends radially from the center of the carriage means, such as from the center 206 in FIGS. 4 A and 4 B and center 258 of FIG. 7.

The line of reference is further defined as that line extending away from the vertical axis and intersecting with an axis extending through the center of a deposition station and perpendicular to the plane of reference. The line of reference is perpendicular to the direction of motion of the carriage means at the center of the deposition station as the carriage means is being transported along a predetermined path which is substantially parallel to the plane of reference at the deposition station.

The guide rollers 274 and 276 of FIGS. 8, 9 and 10 and the center 258 of FIG. 7 afford unconstrained thermal expansion and contraction and distortion of the mask supporting means in all directions including within the plane of reference enabling the mask supporting means illustrated in FIG. 4 through 10, inclusive, to be transported along the predetermined path to index a selected mask of the plurality of deposition masks to the deposition station located between the aligned substrate and the source independent of unconstrained thermal expansion and contraction and distortion of the mask supporting means in all directions including within the plane of reference.

In each of the embodiments set forth herein, a means is provided which is operatively coupled to the appropriate carriage means for transporting the mask supporting means along a predetermined path and for indexing a selected mask of said plurality of deposition masks to the deposition station between an aligned substrate and source.

As illustrated in FIG. 8, each of the masks mounted into each of the apertures would include prealigned registration means 280 which are formed into a plurality of similar predetermined patterns relative to each mask, one of which is located adjacent each of the masks and extends outwardly therefrom towards the gantry means and substrate.

FIG. 11 illustrates one embodiment of a gantry means 62 which is positioned to be accurately registered by means of reference registration means 60 to prealigned registration means 50 located on a deposition mask in a section of an elongated carriage means 22 using the same numerals as in FIGS. 1 and 3. In the embodiment of FIG. 11, the gantry means 62 is part of a gantry assembly 298 which includes a platform 152 and a plurality of flexible members, such as chains 154, which support the gantry means 62 from the platform 152 to permit relative movement between the platform 152 and the gantry means 62. The gantry assembly 298 is operatively coupled by an arm 304 to a gantry loading means which is adapted to move the entire gantry assembly 298 towards and away from the carriage means 22 as shown by arrow 308. The gantry loading means through arm 304 moves the entire gantry assembly 298 relative to the carriage means 22. When the gantry assembly 298 is moved away from the carriage means 22 withdrawing the prealigned registration members 50 from the reference registration members 60, the indexing means operatively coupled to the carriage means 22 indexes the carriage means in a linear direction along a predetermined path illustrated by directional arrow 306. In the embodiment illustrated in FIG. 11 the indexing means is operatively coupled to the carriage means to move the carriage means along a predetermined path. The gantry means is operatively coupled to a gantry loading means which moves the gantry means, substrate and reference registration members 60 towards and away from the carriage means 22.

FIG. 12 illustrates another embodiment of a gantry assembly 298 which is similar in construction to that illustrated in FIG. 11. In FIG. 12, the platform 152 is operatively coupled to a support 310 which is fixed at support point 312. In the embodiment of FIG. 12, the gantry loading means is operatively coupled and is adapted to move the entire carriage means 22 towards and away from the gantry assembly 298 including the gantry means 62, substrate 64 and reference registration members 60. When the gantry loading means has moved the entire carriage means 22 such that the reference registration members 60 are withdrawn from the prealigned registration members 50, the indexing means operatively coupled to the carriage means 22 transports the carriage means 22 to index a different selected mask of a plurality of deposition masks to the deposition station. The gantry loading means moves a carriage means 22 towards and away from the gantry assembly 298 in the directions illustrated by arrow 316. When the carriage means 22 is withdrawn from the gantry assembly 298, the indexing means operatively coupled to the carriage means 22 transports the carriage means and plurality of masks supported thereby including the prealigned registration members 50 in the directions indicated by arrow 306.

FIG. 13 illustrates another embodiment of an annular shaped carriage means 398 having a plurality of radially aligned, spaced planar apertures 400 each of which are adapted to support a deposition mask 402. Each deposition mask has a plurality of prealigned registration members 404 located on the periphery thereof and arranged in a predetermined pattern relative to the mask 602. The prealigned registration members extend from the surface of the mask 402.

A gantry means 408 is a part of a gantry assembly 406 which includes a platform 410 and a plurality of flexible support members 412.

The gantry means 408 is supported relative to the platform 410 by the flexible support members 412 such that relative movement can occur therebetween in order to permit accurate registering of the gantry means 408 through its reference registration members which engage and co-act with the prealigned registration members 404 on each deposition mask 402. The gantry assembly 406 is held in position by support point 414. An indexing means is operatively coupled to the annular shaped carriage means 398 in the manner illustrated herein and is adapted to rotate the same along the directions indicated by arrow 422. The annular shaped carriage means 398 rotates to index a selected mask from the plurality of deposition masks in a deposition station indicated by line 416. When the indexed deposition mask is in position, a gantry loading means, which is operatively coupled to the annular shaped carriage means 398, moves the annular shaped carriage means 398 towards the gantry assembly 406 as illustrated by arrow 420 to load the referenced registration members on the gantry means 408 against the prealigned reference registration members 404 to accurately register the gantry means 408 and substrate relative to the indexed deposition mask.

FIG. 14 illustrates an elongated shaped carriage means 498 having a plurality of planar, spaced aligned apertures 500, each of which are adapted to support a deposition mask 502. Each deposition mask 502 includes a predetermined number of reference registration members 504 positioned thereon the periphery thereof in a predetermined pattern. The reference registration members 504 extend outwardly from the mask 502.

A gantry means in the form of a gantry assembly 506 is adapted to support a substrate in an opposed aligned relationship to the elongated shaped carriage means 498. The gantry assembly 506 includes a gantry means 508 which is supported from a platform 510 by flexible supports such as chains 512. A fixed support 514 holds the gantry platform 510 in fixed position.

An indexing means operatively coupled to the elongated shaped carriage means 498 transports the elongated shaped carriage means 498 along a predetermined path indicated by arrow 522. When a deposition mask 502 is indexed to a deposition station illustrated by dashed line 516, a gantry loading means which is operatively coupled to the elongated shaped carriage means 498 moves the elongated shaped carriage means 498 towards and away from the gantry means 508 in the direction as illustrated by arrow 520. The reference registration members may be located on the gantry means 508 or on the substrate supported thereby as shown in FIG. 2.

FIG. 15 illustrates a fixed annular shaped carriage means 600 having a plurality of planar, spaced aligned apertures 602 formed around the periphery thereof. The centers of the apertures 602 are located in an annular path which is coaxial with the center of rotation of the annular shaped carriage means 600. Each of the apertures 602 includes a deposition mask 604 located therein. Each of the deposition masks 604 includes a predetermined number of prealigned registration members 606 which are formed in a predetermined pattern around the periphery of the masks 604 and which extend from the surface of the mask 604 towards a carousel gantry platform means 612. The carousel gantry platform means 612 includes a plurality of gantry means 608 which is supported therefrom by a flexible connecting means such as for example chains 610. In the embodiment illustrated in FIG. 15, the annular shaped carriage means 600 is fixed in position. However, the carousel gantry platform means 612 is adapted to be indexed by an indexing means by rotating the carousel gantry platform means 612 including the gantry means 608 supported thereby in a direction indicated by arrow 620. Thus, the carousel gantry platform means 612 is rotated to index each of the plurality of gantry means 608 relative to one of each of the deposition masks 604. When the carousel gantry platform means 612 has been indexed to position the gantry means 608 in opposed alignment with its associated selected deposition mask 604, a gantry loading means operatively coupled to the carousel gantry platform means 612 moves the entire carousel gantry platform means 606 towards and away from the annular shaped carriage means 600 in the direction as illustrated by arrow 624.

FIG. 16 illustrates another embodiment of an elongated carriage means 700 having a plurality of planar, spaced aligned apertures 702, each of which are adapted to support a deposition mask 704. Each of the centers of each of the apertures are located in the same nominal plane and are positioned in a predetermined spaced pattern between the aligned apertures 702. Each deposition mask 704 has a predetermined number of prealigned registration members 706 positioned on the periphery thereof in a predetermined pattern. The prealigned registration members 706 extend from the deposition mask towards an elongated gantry platform means 712 which has extending therefrom at least one gantry means 708 which is attached to the elongated gantry platform means 712 by a flexible connecting means such as chains 710. The elongated gantry platform means 712 is operatively coupled to an indexing means to transport the elongated gantry platform means 712 along a linear predetermined path illustrated by arrow 720. The indexing means indexes at least one gantry means 708 to a selected one of the deposition masks 704 positioned in the apertures 702 of the elongated carriage means 700 as illustrated by the arrow 720. In addition, the elongated gantry platform means 712 is operatively coupled to a gantry loading means which is adapted to move at least one of the elongated gantry platform means 712 and carriage means 700 towards and away from each other to load the gantry means 708 to a deposition mask 704 positioned in opposed alignment therewith by the loading of the reference registration members extending from the gantry means 708 against the prealigned registration members 706 extending from the mask 704 located on the elongated shaped carriage means 700. In the embodiment of FIG. 16, the carriage means may be moved in the direction shown by arrow 724 and the elongated gantry platform means 712 may be moved in the direction shown by arrow 722.

In the preferred embodiment of the present invention, the carriage assembly for indexing a selected mask from a plurality of masks is adapted for use with a vapor deposition source which is located at a working or deposition stage. However, it is envisioned and anticipated that the carriage assembly hereof has wide application in all types of deposition systems including, without limitation, sputtering systems, chemical vapor deposition systems, plating techniques and the like.

In addition, it is envisioned that one or more gantry means could be used so that parallel deposition of a layer onto a substrate can occur so that one or more masks and/or substrates are utilized or that one or more working stations are provided during each deposition step.

Of importance is the fact that relative movement between the carriage means and the gantry means provides a coarse indexing of an aperture, mask assembly and associated shields and prealigned registration means relative to a source. The precise and final accurate registering is obtained by aligning the gantry means with the substrate relative to the specific mask after the indexing. Prior to the deposition process, it is anticipated that each of the masks would be prealigned to the substrate on the gantry means such that accurate registration would occur between the gantry means and the mask at any location and when any mask is positioned within the working station.

In addition, it is possible that one of the layers being deposited during the vacuum deposition could be a magnetic layer which could form pole pieces for a thin film magnetic transducer. In such event, it is desirable to preorientate the magnetic means within the magnetic material during deposition thereof. If desired a set of parallel spaced aligned magnets may be positioned relative to a deposition mask to provide the desired magnetic orientation in the magnetic domains. Of course, the spaced parallel aligned magnets could be located selectively within any section as desired.

In utility, a wide range of thin film deposited components can be fabricated using the teachings of this invention. The preferred embodiment of the present invention is to form thin film magnetic transducers which require precisely aligned pole pieces, windings, layers and the like. However, it is possible to fabricate other electrical components such as capacitors, resistors, inductors, transformers and combinations of these components using the multi-step, multi-mask technique including the use of the unique carriage assembly disclosed herein.

It is also envisioned that other techniques be used to increase the reliability, registerability and other effects of the mask substrate interface by providing means for thermally stabilizing the mask and substrate during deposition to minimize misregistration due to the effects of thermal expansion and other uncontrolled variables.

What is claimed is:

1. Apparatus for indexing and accurately registering a deposition mask in a predetermined spacing and position relative to a substrate comprising
    carriage means for supporting a deposition mask having a selected number of prealigned registration members which are located therein in a predetermined pattern, said carriage means being adapted to transport said deposition mask including said prealigned registration members along a predetermined path to a deposition station;
    gantry means for supporting a said substrate at a said deposition station in spaced opposed relationship to said deposition mask located at a said deposition station with said prealigned registration members thereof positioned towards said gantry means;
    reference registration members which are equal in number to the selected number of prealigned registration members which are located on at least one of said gantry means and a said substrate and positioned thereon in a predetermined pattern and which are adapted to co-act with said prealigned registration members loaded thereagainst being adapted to position the gantry means including a said substrate at a predetermined spacing and position relative to said deposition mask;
    indexing means operatively coupled to at least one of said carriage means and said gantry means for transporting said carriage means relative to said gantry means to index said deposition mask to said gantry means; and
    gantry loading means operatively coupled to the other of said carriage means and said gantry means for moving said carriage means and said gantry means towards each other to bring said prealigned registration members and said reference registration members into engagement causing said reference registration members to be loaded against said prealigned registration members being adapted to position said gantry means and a said substrate relative to said deposition mask to accurately register a said substrate at a predetermined spacing and position relative to said indexed deposition mask.

2. Apparatus for indexing and accurately registering a deposition mask in a predetermined spacing and position relative to a substrate comprising
    carriage means for supporting a deposition mask having a selected number of prealigned registration members which are located therein in a predetermined pattern, said carriage means being adapted to transport said deposition mask including said prealigned registration members along a predetermined path to a deposition station;
    gantry means for supporting a said substrate at a said deposition station in spaced opposed relationship to said deposition mask located at a said deposition station with said prealigned registration members thereof positioned towards said gantry means, said gantry means having a reference registration members positioned thereon which are equal in number to said selected number of prealigned registration members and which are located on said gantry means in said predetermined pattern and in a spaced relationship to a said substrate and which are adapted to co-act with said prealigned registration members loaded thereagainst being adapted to position the gantry means including a said substrate at a predetermined spacing and position relative to said deposition mask;
    indexing means operatively coupled to at least one of said carriage means and said gantry means for transporting said carriage means relative to said gantry means to index said deposition mask to said gantry means; and
    gantry loading means operatively coupled to the other of said carriage means and said gantry means for moving said carriage means and said gantry means towards each other to bring said prealigned registration members and said reference registration members into engagement causing said reference registration members to be loaded against said prealigned registration members being adapted to position said gantry means and a said substrate relative to said deposition mask to accurately register a said substrate at a predetermined spacing and position relative to said indexed deposition mask.

3. The apparatus of claim 2 wherein said carriage means is an elongated shaped carriage means having a plurality of deposition masks supported thereby in a substantially planar, spaced aligned relationship and wherein said indexing means is operatively coupled to said elongated shaped carriage means for moving the same along a linear predetermined path and said gantry loading means is operatively coupled to said gantry means to move the same towards and away from said indexed deposition mask.

4. The apparatus of claim 2 wherein said carriage means is a sector shaped carriage means having a plurality of deposition masks supported thereby in a radially aligned, spaced relationship and wherein said indexing means is operatively coupled to the sector shaped carriage means for moving the same along a curvilinear predetermined path and said gantry loading means is operatively coupled to said gantry means to move the same towards and away from said indexed deposition mask.

5. The apparatus of claim 2 wherein said carriage means is an annular shaped carriage means having a plurality of deposition masks supported thereby in a radially, aligned, spaced relationship and wherein said indexing means is operatively coupled to said annular shaped carriage means for moving the same along a curvilinear predetermined path and said gantry loading means is operatively coupled to said gantry means to move the same towards and away from said indexed deposition mask.

6. Apparatus for indexing and accurately registering a deposition mask in a predetermined spacing and position relative to a substrate comprising carriage means for supporting a deposition mask having a selected number of prealigned registration members which are located therein in a predetermined pattern, said carriage means being adapted to transport said deposition mask including said prealigned registration members along a predetermined path to a deposition station;

gantry means for supporting a said substrate at a said deposition station in spaced opposed relationship to said deposition mask located at a said deposition station with said prealigned registration members thereof positioned towards said gantry means;

reference registration members which are equal in number to the selected number of prealigned registration members and which are located on a said substrate and positioned thereon in a predetermined pattern and which are adapted to coact with said prealigned registration members loaded thereagainst being adapted to position the gantry means including a said substrate at a predetermined spacing and position relative to said deposition mask;

indexing means operatively coupled to at least one of said carriage means and said gantry means for transporting said carriage means relative to said gantry means to index said deposition mask to said gantry means; and gantry loading means operatively coupled to the other of said carriage means and said gantry means for moving said carriage means and said gantry means towards each other to bring said prealigned registration members and said reference registration members into engagement causing said reference registration members to be loaded against said prealigned registration members being adapted to rotate and position said gantry means and a said substrate relative to said deposition mask to accurately register a said substrate at a predetermined spacing and position relative to said indexed deposition mask.

7. The apparatus of claim 6 wherein said carriage means is an elongated shaped carriage means having a plurality of deposition masks supported thereby in a substantially planar, spaced aligned relationship and wherein said indexing means is operatively coupled to said elongated shaped carriage means for moving the same along a linear predetermined path and said gantry loading means is operatively coupled to said gantry means to move the same towards and away from said indexed deposition mask.

8. The apparatus of claim 6 wherein said carriage means is a sector shaped carriage means having a plurality of deposition masks supported thereby in a radially aligned, spaced relationship and wherein said indexing means is operatively coupled to the sector shaped carriage means for moving the same along a curvilinear predetermined path and said gantry loading means is operatively coupled to said gantry means to move the same towards and away from said indexed deposition mask.

9. The apparatus of claim 6 wherein said carriage means is an annular shaped carriage means having a plurality of deposition masks supported thereby in a radially, aligned, spaced relationship and wherein said indexing means is operatively coupled to said annular shaped carriage means for moving the same along a curvilinear predetermined path and said gantry loading means is operatively coupled to said gantry means to move the same towards and away from said indexed deposition mask.

10. Apparatus for indexing and accurately registering a selected one of a plurality of deposition masks in a predetermined spacing and position relative to a substrate comprising carriage means for supporting a plurality of deposition masks, said carriage means having an upper surface and a lower surface and a plurality of predetermined apertures extending from said upper surface to said lower surface and being positioned in a planar aligned spaced relationship to each other, one of each of said deposition masks being adapted to be located in any one of said apertgures and each of said depostition masks having the same selected number of prealigned registration members positioned thereon and extending therefrom in a predetermined pattern, said prealigned registration members being adapted to coact with reference registration members formed in said predetermined pattern and loaded thereagainst, said carriage means being adapted to transport said deposition masks including said prealigned registration members along a predetermined path to a deposition station;

indexing means operatively coupled to said carriage means for transporting said carriage means including said deposition masks and said prealigned registration members along said predetermined path and for indexing a selected one of said plurality of deposition masks to said deposition station; and gantry means including gantry loading means for supporting a said substrate at said deposition station in spaced opposed relationship to said selected one of said plurality of deposition masks and for moving said gantry means and a said substrate towards and away from said selected one of said plurality of deposition masks indexed to said deposition station, said gantry means having reference registration members located thereon which are positioned in a spaced relationship to a said substrate in said predetermined pattern and which are equal in number to said selected number of prealigned registration members, said reference registration members being positioned to face said select one of said plurality of deposition masks, said gantry loading means being adapted to move said gantry means and a said substrate towards said indexed selected one of said deposition masks to bring said reference registration members into engagement with said prealigned registration members causing said reference registration members to be loaded against said prealigned registration members and being adapted to position said gantry means and a said substrate relative to each other to accurately register a said substrate at a predetermined spacing and position relative to said indexed selected one of said plurality of deposition masks.

11. The apparatus of claim 10 further comprising
a plurality of shields each having a cavity extending therethrough and one of each of said plurality of shields being positioned relative to the other surface of each of said plurality of deposition masks opposite to that having said prealigned registration members positioned therein and extending therefrom, each one of said plurality of shields extending a predetermined distance from said other surface of its associated deposition mask and being adapted to be transported by its associated deposition mask and indexed therewith by said carriage means.

12. The apparatus of claim 11 further comprising
a vacuum deposition source located at said deposition station and being adapted to produce a vapor of preselected deposition material which is confined within the cavity of one of said plurality of shields and passes through said indexed selected one of said plurality of deposition masks onto a surface of a said substrate positioned at a predetermined spacing and position relative to said selected one of said plurality of deposition masks.

13. The apparatus of claim 10 further comprising
programming means operatively coupled to said indexing means and said gantry loading means for actuating said gantry loading means to afford relative movement between said gantry means and a said indexed selected one of said plurality of said deposition masks supported in the carriage means to separate the same and to afford relative movement between said carriage means and gantry means to move the same towards each other to load and accurately register a said substrate supported by said gantry means to an indexed selected one of said plurality of deposition masks supported by said carriage means and for actuating said indexing means for transporting said carriage means including said plurality of deposition masks along said predetermined path when said gantry means is separated from the carriage means to index a selected one of said plurality of deposition masks at said deposition station.

14. The apparatus of claim 10 wherein said carriage means is formed of a sector-shaped member having a plurality of apertures formed around the periphery thereof for supporting a selected one of each of said plurality of masks in an aperture with the centers of each aperture being radially aligned with the center of said sector-shaped member and wherein said indexing means includes means for rotating said sector-shaped member through a predetermined angle of rotation.

15. The apparatus of claim 10 wherein said carriage means is formed of an elongated shaped member having a plurality of apertures formed therein for supporting a selected one of each of said plurality of deposition masks in an aperture with the centers of each aperture aligned in a substantially straight line and wherein said indexing means includes means for transporting the elongated shaped member along a predetermined path which is substantially parallel to the aligned aperture centers.

16. The apparatus of claim 10 wherein said carriage means is formed of an annular shaped member having a plurality of apertures formed around the periphery thereof for supporting a selected one of said plurality of said deposition masks in an aperture with the centers of each aperture being aligned in an annular path which is coaxially aligned with the center of said annular shaped member and wherein said indexing means includes means for rotating said annular shaped carriage means through a predetermined angle of rotation.

17. A carriage assembly for indexing a selected mask from a plurality of masks to a deposition station between an aligned substrate and source comprising
a carriage means including
elongated means adapted for supporting each mask of a said plurality of masks in a predetermined linear position relative to each other;
means operatively coupled to said elongated mask supporting means for confining displacement of said elongated mask supporting means at a point of confinement and for confining rotational movement of said elongated mask supporting means about a vertical axis which passes through a plane of reference at said point of confinement, said point of confinement being defined as a point where said vertical axis intersects a line of reference located within the plane of reference, said line of reference extending away from said vertical axis and intersecting with an axis extending through the center of a deposition station and perpendicular to said plane of reference and wherein the line of reference is perpendicular to the direction of linear motion of the elongated mask supporting means at the center of the deposition station as the elongated mask supporting means is being transported along a predetermined linear path which is substantially parallel to said plane of reference at the deposition station and for affording unconstrained thermal expansion and contraction and distortion of said elongated mask supporting means in all directions including within said plane of reference enabling said elongated mask supporting means to be transported along said predetermined path to index a selected mask of said plurality of masks to a said deposition station between said aligned substrate and a said source indepndent of unconstrained thermal expsnion and contraction and distortion of said elongated mask supporting means in all directions including within said plane of reference;
means operatively coupled to said carriage means for transporting said elongated mask supporting means along a predetermined linear path and for indexing a selected mask of said plurality of masks to a said deposition station between an aligned substrate and source;

prealigned registration means formed into a plurality of predetermined patterns one of each of which is located adjacent each of said masks and positioned towards a said substrate; and gantry means adapted to support a said substrate in opposed alignment to a said source and relative to said carriage means which is adapted to be transported therebetween said gantry means including reference registration means positioned thereon which are equal in number to the said selected number of prealigned registration members and which are located on said gantry means in a said predetermined pattern and in a spaced relationship to a said substrate and which are adapted to co-act with said prealigned registration means loaded thereagainst being adapted to position the gantry means including a said substrate relative to a mask.

18. The carriage assembly of claim 17 further comprising gantry loading means operatively coupled to at least one of said carriage means and said gantry means for establishing relative movement between said carriage means and said gantry means towards each other to bring said prealigned registration members and said reference registration members into engagement causing said reference registration members to be loaded against said prealigned registration members being adapted to position said gantry means and a said substrate relative to said deposition mask to accurately register a said substrate at a predetermined spacing and position relative to said indexed deposition mask.

19. The carriage assembly of claim 18 further comprising programming means operatively coupled to said indexing means and said gantry loading means for actuating said gantry loading means to afford relative movement between said gantry means and a said indexed selected one of said plurality of said deposition masks supported in the carriage means to separate the same and to afford relative movement between said carriage means and gantry means to move the same towards each other to load and accurately register a said substrate supported by said gantry means to an indexed selected one of said plurality of stabilized deposition masks supported by said carriage means and for actuating said indexing means for transporting at least one of said carriage means including said plurality of deposition masks and said gantry means along said predetermined path when said gantry means is separated from the carriage means to index a selected one of said plurality of deposition masks at said deposition station.

20. The carriage assembly of claim 19 wherein said gantry loading means is operatively coupled to said gantry means for moving a said substrate towards and away from said carriage means to effect the loading of the prealigned registration means with the reference registration means.

21. The carriage assembly of claim 19 wherein said gantry loading means is operatively coupled to said carriage means for moving said carriage means towards and away from said gantry means to effect the loading of the prealigned registration means with the reference registration means.

22. The carriage assembly of claim 17 where each of said deposition masks are thermally stabilized.

23. The carriage assembly of claim 17 wherein said gantry means include a substrate and said gantry means and substrate are thermally stabilized.

24. The method of indexing and accurately registering a deposition mask from a plurality of deposition masks in a predetermined spacing and position relative to a substrate comprising supporting a plurality of deposition masks each of which have a plurality of prealigned registration members formed in a predetermined pattern thereon for movement along a predetermined path;

supporting a gantry means having means for supporting a said substrate wherein at least one of the gantry means and a said substrate has a plurality of reference registration members located in said predetermined pattern and which are equal to the number of prealigned registration members on each of said plurality of deposition masks and positioned to face said prealigned registration members located on each of said deposition masks;

indexing at least one of said plurality of deposition masks to a deposition station; and accurately registering said indexed deposition mask and a said substrate at a predetermined spacing and position by relative movement of said indexed deposition mask and said gantry means towards each other to bring said prealigned registration members and said reference registration members into engagement causing said reference registration members to be loaded against said prealigned registration members which are adapted to position said gantry means and a said substrate at a predetermined spacing and position relative to said indexed deposition mask.

25. The method of claim 24 wherein said plurality of deposition masks are supported in a carriage assembly and further comprising the steps of controlling indexing of said carriage assembly supporting said plurality of deposition masks and said gantry means relative to each other with an indexing means operatively coupled to at least one of a carriage assembly and said gantry means; and controlling accurate registering of a said indexed deposition mask in said carriage assembly and said gantry means with a gantry loading means operatively coupled to at least one of a said carriage assembly and said gantry means.

26. The method of claim 25 further comprising the steps of programming said gantry loading means for moving at least one of said gantry means and said carriage assembly from loaded position to a withdrawn position, programming said indexing means to index a selected deposition mask from said plurality of deposition masks on said carriage assembly to a deposition station and programming said gantry loading means to accurately register said gantry means having a said substrate to said indexed deposition mask.

27. The method of indexing and accurately registering a deposition mask from a plurality of deposition masks in a predetermined spacing and position relative to a plurality of substrates comprising supporting a plurality of deposition masks each of which have a plurality of prealigned registration members formed in a predetermined pattern thereon for movement along a predetermined path;

supporting a plurality of gantry means each of which have means for supporting a said substrate wherein at least one of the plurality of gantry means and a said plurality of substrates have a plurality of reference registration members located thereon in said predetermined pattern and which are equal to the number of prealigned registration members on each of said plurality of deposition masks and positioned to face said prealigned registration members located on each of said deposition masks;

indexing at least one of said plurality of deposition masks and said plurality of gantry means to index a deposition mask to a gantry means at a deposition station; and accurately registering said indexed deposition mask and said indexed gantry means at a predetermined spacing and position by relative movement of said indexed deposition mask and said indexed gantry means towards each other to bring said prealigned registration members and said reference registration members into engagement causing said reference registration members to be loaded against said prealigned registration members which are adapted to position said indexed gantry means and a said substrate at a predetermined spacing and position relative to said indexed deposition mask.

28. The method of claim 27 wherein said plurality of deposition masks are supported in a carriage assembly and said plurality of gantry means are supported by a gantry platform support assembly and further comprising the steps of controlling indexing of said carriage assembly supporting said plurality of deposition masks and said gantry platform support means relative to each other with an indexing means operatively coupled to at least one of a carriage assembly and said gantry platform support means; and controlling accurately registering of said indexed deposition mask in said carriage assembly and said gantry means in a gantry support platform means with a gantry loading means operatively coupled to at least one of a said carriage assembly and said gantry platform support means.

29. The method of claim 28 further comprising the steps of programming said gantry loading means for moving at least one of said gantry platform support means and said carriage assembly from loaded position to a withdrawn position, programming said indexing means to index at least one of a selected deposition mask from said plurality of deposition masks on said carriage assembly and at least one of said gantry means from said gantry platform support assembly to a deposition station and programming said gantry loading means to accurately register said indexed gantry means having a said substrate to said indexed deposition mask.

* * * * *